United States Patent [19]

Fattori et al.

[11] Patent Number: 5,767,703
[45] Date of Patent: Jun. 16, 1998

[54] DIFFERENTIAL BUS DRIVERS

[75] Inventors: Frank Fattori, Clapham, Great Britain; Marco Corsi, Dallas, Tex.

[73] Assignee: Texas Instruments Incorporated, Dallas, Tex.

[21] Appl. No.: 818,206

[22] Filed: Mar. 14, 1997

Related U.S. Application Data

[63] Continuation of Ser. No. 191,839, Feb. 4, 1994, abandoned.

[30] Foreign Application Priority Data

Feb. 3, 1993 [GB] United Kingdom .................. 9302214

[51] Int. Cl.$^6$ .......................................................... H03K 3/00
[52] U.S. Cl. ........................ 327/108; 327/109; 327/332; 327/482
[58] Field of Search ............................... 307/270, 362, 307/493, 494, 553, 562; 327/108, 109, 111, 112, 312, 316, 323, 332, 538, 540, 87, 482, 484

[56] References Cited

U.S. PATENT DOCUMENTS

| | | | |
|---|---|---|---|
| 4,591,734 | 5/1986 | Laughton | 307/270 |
| 4,827,158 | 5/1989 | Matsumura | 307/270 |
| 4,959,561 | 9/1990 | McDermott | 307/443 |
| 5,300,837 | 4/1994 | Fischer | 327/538 |
| 5,317,254 | 5/1994 | Olson | 323/316 |
| 5,357,149 | 10/1994 | Kimura | 327/538 |

FOREIGN PATENT DOCUMENTS

A-0 102 110  8/1983  European Pat. Off. .

Primary Examiner—Timothy P. Callahan
Assistant Examiner—Jung Ho Kim
Attorney, Agent, or Firm—Richard L. Donaldson; William B. Kempler

[57] ABSTRACT

This invention relates to differential bus drivers for use in, for example, communication systems. The driver achieves highly symmetrical wave forms at the output stage for both high and low side drivers. In addition, the layout of components of the high and low side drivers is substantially identical which allows production of the driver as an integrated circuit with a simple layout.

5 Claims, 1 Drawing Sheet

DIFFERENTIAL BUS DRIVERS

This application is a Continuation of application Ser. No. 08/191,839, filed Feb. 4, 1994, abandoned.

This invention relates to Differential Bus Drivers for use in, for example, electronic communications systems.

In electronic communication systems such as, for example, Automotive multiplex wiring, computer interfaces, etc, there are often one or more data buses connecting subcircuits of the system. In order for a signal to be transmitted from the data buses to either internal or external subcircuits of the system, Bus drivers are generally utilised. One such type of Bus driver circuit is a Differential bus Driver.

Differential bus drivers are generally incapable of producing symmetrical outputs when operating with both current sink and current source capabilities. In addition, the circuitry required to facilitate the two types of capabilities is often fairly complex in layout and design.

Accordingly one object of the present invention is to provide a differential bus driver which achieves highly symmetrical wave forms.

Another object of the invention is to provide a differential bus driver which is as applicable to voltage mode interface standards such as RS422, Controller Area Network (CAN), Automotive Multiplex Wiring System (Abus) as it is to current mode standards like Vehicle Area Network (VAN).

According to one aspect of the present invention, there is provided a differential bus driver having a low side driver circuit and a high side driver circuit, said circuits both having substantial identical AC and DC characteristics wherein each circuit comprises an amplifier configured to monitor output of the driver circuit and maintain said output at a predetermined value, a first semiconductor device adapted to produce the ouput and a second semiconductor device capable of driving the first semiconductor device in response to a signal generated by said amplifier.

This has the advantage of providing highly symmetrical output stages since the devices are matched on the same Integrated Circuit. In addition, the layout of the driver is greatly simplified due to the symmetrical design.

Preferable the driver further comprises a third semiconductor device forming a current mirroring device with the first semiconductor device, such that the amplifier monitors a characteristic of the third semiconductor device in order to monitor and maintain said output.

Reference will now be made, by way of example, to the accompanying drawings, in which.

Figure 1:
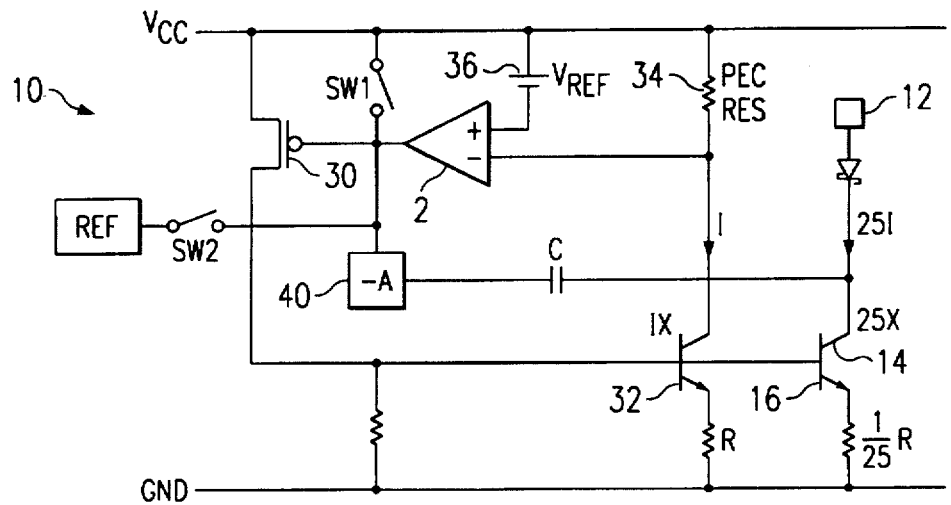
FIG. 1 is a circuit diagram of a low side driver according to the present invention.
Figure 2:
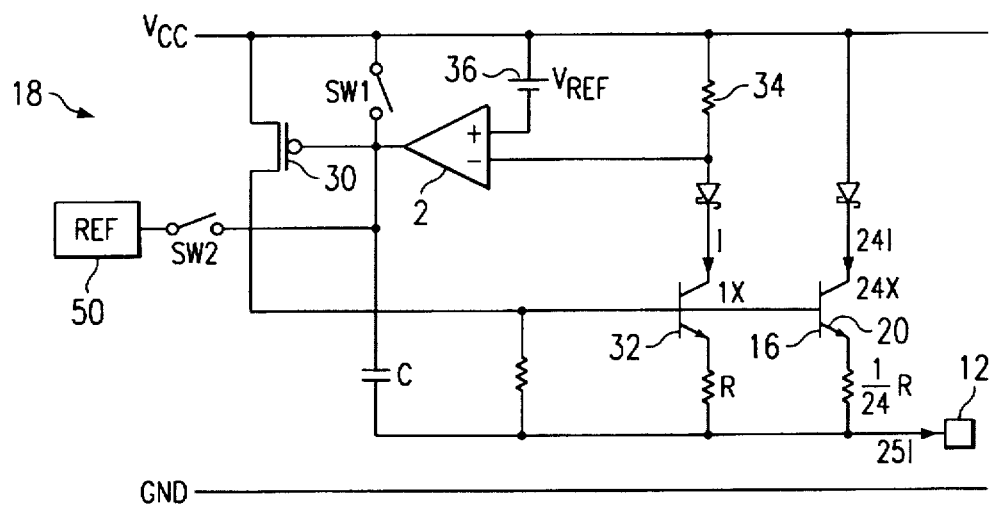
FIG. 2 is a circuit diagram of a high side driver according to the invention.

The circuits of FIG. 1 and 2 show respectively an output driver with current sink capability (low side driver) and output driver with current source capability (high side driver). These circuits are under current mode control. The aim of the illustrated circuits is to illustrate a current source which has identical AC and DC characteristics to a matching current sink. This is achieved by using a feedback system to control how the currents are generated. The circuits allow the use of the same amplifier scheme 2 in both the source and the sink circuit. This is possible due to the fact that in both circuits the current in the output is measured with respect to the positive rail Vcc. In one circuit 10 (the current sink) the output 12 is taken from the collector 14 of an NPN 16 and in the other circuit 18 (the current source) it is taken from the Emitter 20. Diodes are included to allow the outputs to be of high impedance to the outer rail voltages. Because both circuits use a matched PMOS 30, amplifier 2 and NPN 16 the propagation delay also is well matched. The propagation delay when the circuit is turned on can be further enhanced by forcing the gate voltage to a point which is dependent on process parameters of the NPN and PMOS using SW2. Such a reference can be made as in the circuit of FIG. 3. The output is turned on and off by respectively opening and closing SW1. SW1 and SW2 may be implemented using MOS switches.

The circuits can be adapted for use in voltage mode control in the following manner.

Slew rate can be controlled by the addition of a Capacitor C and the use of a current mirror to invert the current signal in the case of the low side. As I=C(dv/dt) if the current provided into the capacitor is controlled a controlled slew rate can be achieved.

The high and low side drivers will now be described in greater detail.

Both high side and low side drivers use the same components. An output NPN 16 is configured in either common collector mode (FIG. 2) or in common emitter mode (FIG. 1). The output stage current is monitored by a current mirror configured NPN 32 connected to the output NPN. To sense the current only a small proportion of the output stage current, for example, 1/50th is fed through the current mirror. For the high side driver, this current adds to the output stage, but can be compensated for and forms only a small error.

The current in the output leg of the current mirror is converted to a voltage signal by means of a precision resistor 34, made of a material which matches to the current defining element (current reference circuit) elsewhere in the circuit. A high speed transconductance amplifier 2 then measures the voltage across the sense resistor, the amplifier differential input being referenced to a precision voltage reference 36. Thus the desired current setting can be defined either by an internal voltage source, or by an external current source. An external current source can be an inherently more precise scheme since the absolute value of current defining resistors on an IC is difficult to define precisely.

In both circuits, the output NPN is driven by a PMOS transistor 30. The transconductance amplifier output drives the gate of the PMOS device. In operation, the amplifier is allowed to drive the gate of the PMOS such that the NPN delivers output current up to the limit determined by the feedback loop thus formed. Thus the output stages are current limited. To set the system frequency response, a capacitor can be added to the gate of the PMOS (which is already capacitive) and the transconductance (Gm) of the transconductance amplifier is programmed (e.g. by means of a resistor).

If desired the feedback to the PMOS gate may also be influenced by the voltage on the driver output. For example, capacitive feedback from the output to the gate of the PMOS can cause the output voltage swing to the slew rate controlled. The polarity of the feedback must be adjusted depending upon the polarity of the output, i.e. depending upon whether it is high side or low side. This may be achieved using an inverter 40.

Also, to control the DC output voltage swing, DC voltage feedback loops (not shown) can also be formed. This can, for example, be made to limit the saturation of the NPN output stage (in the low side driver).

It is desired in one application of the driver that the output stages be primarily current controlled, and thus should present a high impedance current characteristic independent of the output voltage.

For the low side driver, this is achieved by relying upon the high output impedance characteristics of conventional Integrated Circuit NPN transistors which typically have an "early voltage" of near 100V. The PMOS VDS voltage in this case remains constant, and hence the Gm characteristics of this device are not varied as the output voltage moves.

However, for the high side driver, this is not the case. The NPN as before has an inherently high output impedance, but as the output voltage moves, so does the PMOS VDS voltage.

This causes a dynamic change to the DC and AC characteristics of the feedback loop. The application of a very high speed transconductance amplifier largely eliminates these effects except at the extreme point as the PMOS VDS collapses to near zero.

Figure 3:
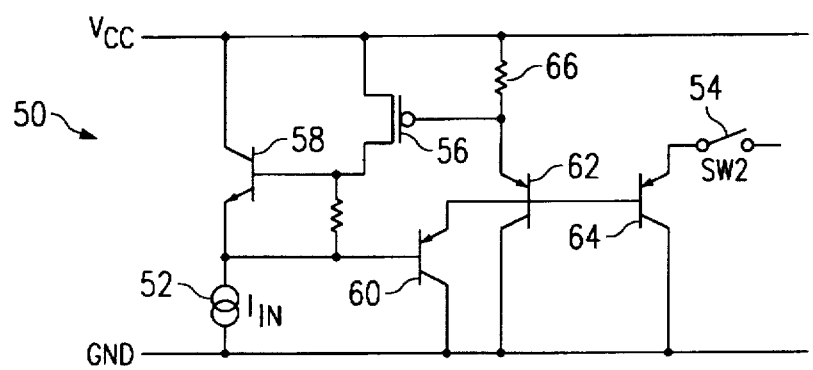
FIG. 3 is a circuit diagram of a preconditioning circuit for the driver of FIG. 1 or FIG. 2.

The application of these drivers requires the dynamic current and voltage behaviour of the two output stages to be as symmetrical as possible. At the point of initial turn on, the low side driver output voltage is typically at say 5V (Vsupply=5V). For the high side driver, the output voltage is zero. Thus at the point of turn ON the VDS voltages for the two PMOS devices are almost identical. A preconditioning circuit (a scheme of which is shown in FIG. 3 and described in more detail below) defines an "ideal" aiming voltage that the PMOS gate should be at in order to generate the required current on the output stage, and is approximately the same VDS for either high or low side drivers.

At the point of turn on, this voltage is impressed upon the output of the transconductance amplifier, to provide a rapid turn on from zero output current to maximum output current.

Typically, the output drivers would be loaded by a passive cable having a resistive and capacitive load; as the driver stages turn on, thus the output voltages change according to the current generated and the load impedance characteristics (Ohms law applies).

If this is primarily capacitive the constant current driver output stages cause a linear increase in output voltage over time. Thus for the high side driver, the PMOS VDS changes. The feedback loop frequency response is optimised such that the loop speed is relatively fast compared to the required transition speed of the output voltage wave form. Thus the changing VDS of the high side PMOS has little impact upon the eventual current and voltage wave forms generated.

Referring to the preconditioning circuit, this can be designed in many ways. One preferred embodiment of the circuit 50 is shown in FIG. 3. The circuit comprises a current source 52 which generates a current that after processing is output via switch 54 to the PMOS 30 in FIGS. 1 and 2. The circuit 50 further includes a PMOS 56, an NPN transistor 58 and three PNP transistors 60, 62, 64 and a resistor 66. Transistors 64 has a rectifying function whilst the other components all form part of a feed back loop which controls the Vbe on transistor 64.

The high side and low side drivers schemes can be generated from identical circuits, simply changing the output node connections. Various blocking diodes may be required and these would be replicated for both types of driver to ensure the same parasitics apply. Similar considerations can be applied to any other specific circuit modifications required for either high or low side driver.

Since both circuits are essentially the same, identical structures and whole cells they can be implemented on an integrated circuit The identical circuits, scheme of operation and matching layouts all help to ensure the eventual output wave forms are as symmetrical as possible.

Voltage mode standards provide control over the wave shapes by limiting the maximum dv/dt and in current mode systems the outputs act like current sources and sinks and the wave forms are then controlled by the line impedance.

We claim:

1. A differential bus driver comprising:
    first and second rails to be respectively maintained at a supply voltage magnitude and a reference voltage magnitude;
    a low side driver circuit disposed between the first and second rails;
    a high side driver circuit independent of said low side driver circuit and disposed between the first and second rails;
    each of said low side driver circuit and said high side driver circuit having an output and having substantially identical AC and DC characteristics, and each of said low side driver circuit and said high side driver circuit respectively including
        a first semiconductor device for producing the output of the corresponding one of said low side driver circuit and said high side driver circuit, said first semiconductor device of said low side driver circuit being connected to said second rail maintained at a reference voltage magnitude, and said first semiconductor device of said high side driver circuit being connected to said first rail maintained at a supply voltage magnitude,
        a second semiconductor device connected to said first rail maintained at a supply voltage magnitude and to said first semiconductor device,
        an amplifier having first and second inputs connected to said first rail and an output connected to said second semiconductor device, and
        means disposed in the respective connections between each of said first and second inputs of said amplifier and said first rail for establishing differential voltage values as inputs to said amplifier, enabling said amplifier to establish a predetermined current;
    said second semiconductor device driving said first semiconductor device in response to an output signal generated by said amplifier;
    said amplifier thereby monitoring the output of the respective one of said low side driver circuit and said high side driver circuit for maintaining said output at a predetermined value,
    wherein the first semiconductor device of said high side driver circuit is an NPN bipolar transistor having collector, base and emitter electrodes and configured in common collector mode.

2. A differential bus driver comprising:
    first and second rails to be respectively maintained at a supply voltage magnitude and a reference voltage magnitude;
    a low side driver circuit disposed between the first and second rails;
    a high side driver circuit independent of said low side driver circuit and disposed between the first and second rails;
    each of said low side driver circuit and said high side driver circuit having an output, and each of said low side driver circuit and said high side driver circuit respectively including
        a first semiconductor device for producing the output of the corresponding one of said low side driver circuit and said high side driver circuit, said first semiconductor device of said low side driver circuit being connected to said second rail maintained at a reference voltage magnitude, and said first semiconductor device of said high side driver circuit being connected to said first rail maintained at a supply voltage magnitude, a second semiconductor device connected to said first rail maintained at a supply voltage magnitude and to said first semiconductor device, an amplifier having first and second inputs connected to said first rail and an output connected to said second semiconductor device, and means disposed in the respective connections between each of said first and second inputs of said amplifier and said first rail for establishing differential voltage values as inputs to said amplifier enabling said amplifier to establish a predetermined current;

said second semiconductor device driving said first semiconductor device in response to an output signal generated by said amplifier;

said amplifier thereby monitoring the output of the respective one of said low side driver circuit and said high side driver circuit for maintaining said output at a predetermined value;

the corresponding first semiconductor devices, second semiconductor devices, and amplifiers of the respective said low side driver circuit and said high side driver circuit matching each other in operational performance to provide each of said low side driver circuit and said high side driver circuit with substantially identical AC and DC characteristics with respective propagation delays of substantially equal magnitude; wherein said first semiconductor device of each of said low side driver circuit and said high side driver circuit is a bipolar transistor having collector, base and emitter electrodes;

said second semiconductor device being connected to the base electrode of said bipolar transistor for turning on said bipolar transistor in response to an output signal generated by said amplifier;

said bipolar transistor of said low side driver circuit being connected in a common emitter mode; and said bipolar transistor of said high side driver circuit being connected in a common collector mode.

3. A differential bus driver as set forth in claim 2, wherein said second semiconductor device of each of said low side driver circuit and said high side driver circuit is an MOS transistor having source and drain regions with a channel region therebetween, one of said source and drain regions of said MOS transistor being connected to the base electrode of said bipolar transistor of the corresponding one of said low side driver circuit and said high side driver circuit.

4. A differential bus driver comprising:

first and second rails to be respectively maintained at a supply voltage magnitude and a reference voltage magnitude;

a low side driver circuit having an output and disposed between the first and second rails, said low side driver circuit including a first semiconductor device connected to said second rail maintained at a reference voltage magnitude for producing the output of said low side driver circuit, a second semiconductor device connected to said first rail maintained at a supply voltage magnitude and connected to said first semiconductor device, a first amplifier having first and second inputs connected to said first rail and an output connected to said second semiconductor device, means disposed in the respective connections between each of said first and second inputs of said first amplifier and said first rail for establishing differential voltage values as inputs to said first amplifier enabling said first amplifier to establish a predetermined current, and said second semiconductor device driving said first semiconductor device in response to an output signal generated by said first amplifier;

a high side driver circuit independent of said low side driver circuit, said high side driver circuit having an output and disposed between the first and second rails, said high side driver circuit including a third semiconductor device connected to said first rail maintained at a supply voltage magnitude for producing the output of said high side driver circuit, a fourth semiconductor device connected to said first rail maintained at a supply voltage magnitude and connected to said third semiconductor device, a second amplifier separate from the first amplifier of said low side driver circuit and having first and second inputs connected to said first rail and an output connected to said fourth semiconductor device, means disposed in the respective connections between each of said first and second inputs of said second amplifier and said first rail for establishing differential voltage values as inputs to said second amplifier enabling said second amplifier to establish a predetermined current, and said fourth semiconductor device driving said third semiconductor device in response to an output signal generated by said second amplifier;

each of said low side driver circuit and said high side driver circuit having substantially identical AC and DC characteristics, and the first and second amplifiers of said low side driver circuit and said high side driver circuit respectively monitoring the outputs of said low side driver circuit and said high side driver circuit for maintaining the outputs of said low side driver circuit and said high side driver circuit at predetermined values; wherein said first semiconductor device of said low side driver circuit and said third semiconductor device of said high side driver circuit are respectively bipolar transistors having collector, base, and emitter electrodes;

said second semiconductor device being connected to the base electrode of said bipolar transistor of said low side driver circuit;

said fourth semiconductor device being connected to the base electrode of said bipolar transistor of said high side driver circuit;

said bipolar transistor of said low side driver circuit being connected in a common emitter mode, and said bipolar transistor of said high side driver circuit being connected in a common collector mode and wherein the first semiconductor device of said low side driver circuit and the third semiconductor device of said high side driver circuit, the second semiconductor device of said low side driver circuit and the fourth semiconductor device of said high side driver circuit, and the first amplifier of said low side driver circuit and the second amplifier of said high side driver circuit have correspondingly matched operational characteristics with respect to each other such that said low side driver circuit and said high side driver circuit have substantially identical AC and DC characteristics with respective propagation delays of substantially equal magnitude.

5. A differential bus driver as set forth in claim 4, wherein said second semiconductor device of said low side driver circuit and said fourth semiconductor device of said high side driver circuit are respectively MOS transistors;

the MOS transistor being connected to the base electrode of said bipolar transistor in each of said low side driver circuit and said high side driver circuit.

* * * * *